United States Patent
Chen

(12) United States Patent (10) Patent No.: US 6,951,001 B2
Chen (45) Date of Patent: Sep. 27, 2005

(54) METHOD FOR ANALYSIS OF INTERCONNECT COUPLING IN VLSI CIRCUITS

(75) Inventor: Thomas W. Chen, Ft. Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 267 days.

(21) Appl. No.: 10/222,268

(22) Filed: Aug. 16, 2002

(65) Prior Publication Data

US 2004/0034840 A1 Feb. 19, 2004

(51) Int. Cl.[7] ............................................... G06F 9/45
(52) U.S. Cl. ............................................ 716/5; 703/13
(58) Field of Search ....................... 716/4–6; 703/13–14

Primary Examiner—Stacy A. Whitmore

(57) ABSTRACT

A method for analyzing coupling between interconnects in a VLSI processor to simulate the impact of process variations by the use of model-fitted equations to determine a delay change curve for a coupled interconnect. Simulated curves are first used to determine the parameters in the model-fitted equations. These model-fitted equations are then used to derive the output waveform at the output of a victim line using superposition of noise waveforms calculated for a plurality of aggressors. The output waveform is then quadratically expanded to obtain the delay change curve, and the statistical mean and the standard deviation of the victim delay through the coupled interconnect are calculated by using said quadratic function and the statistical behavior of all inputs to the coupled interconnect.

23 Claims, 4 Drawing Sheets

US 6,951,001 B2

METHOD FOR ANALYSIS OF INTERCONNECT COUPLING IN VLSI CIRCUITS

TECHNICAL FIELD

The present invention relates generally to computer processor design, and more particularly, to a method for analyzing coupling between interconnects in a VLSI processor to simulate the impact of process variations.

BACKGROUND

Continuing scaling of the CMOS fabrication process to allow increasing number of devices on a VLSI chip has caused 'within-die' variations to become a significant problem. These within-die variations result from manufacturing process variations such as Le (the effective channel length) and Vt (threshold voltage) as well as supply voltage and temperature variations. Within-die variations cause an undesirable uncertainty with respect to on-chip signal timing. Conventional timing analysis for VLSI chips uses different values for process, voltage, and temperature corners (maximum allowable combinations of these values) for maximum and minimum signal delay analysis. Such an approach often leads to 'overdesigning', which may cause unnecessarily high power requirements and reliability problems.

Previously existing methods for interconnect coupling analysis have typically used Monte Carlo simulation statistical analysis techniques. However, Monte Carlo simulation takes an extremely long time and does not provide a realistic solution for analyzing complex VLSI circuits. Nearly all existing analytical methods deal exclusively with variations in active devices such as transistors and logic gates. With the increasing aspect ration of device interconnects, coupling between the interconnects and its impact on signal transmission have played an increasing role in VLSI circuit analysis. A signal path from a point on a chip to another point on the chip consists not only of logic gates and other devices, but also includes the interconnects between the devices. As CMOS technology continues to scale, the proportion of the total signal delay time attributable to interconnect delay increases. Therefore, the importance of accuracy of modeling interconnect delay becomes increasingly important. In addition to accuracy limitations, existing simulation methods incorporating linear Taylor expansion cannot be directly applied to multi-aggressor, partial coupling cases, which are common in real applications.

SUMMARY

The present system overcomes the aforementioned problems of the prior art and achieves an advance in the field by providing a method for analyzing the statistical behavior of multiple coupled interconnects with an uncertain signal arrival time at each interconnect input. A quadratic dcc function is constructed, using model-fitted equations and their first-order and second-order derivatives, and the relative arrival time difference between the aggressors and the victim is used to generate the waveform at the output of the victim line by superposition, onto the without-noise waveform, of each of the noise waveforms generated by measuring the simulated noise waveform induced by a particular aggressor on the victim line. The statistical mean and the standard deviation of the victim delay through the coupled interconnect are calculated by using said quadratic function and the statistical behavior of all inputs to the coupled interconnect.

DETAILED DESCRIPTION

Figure 1:
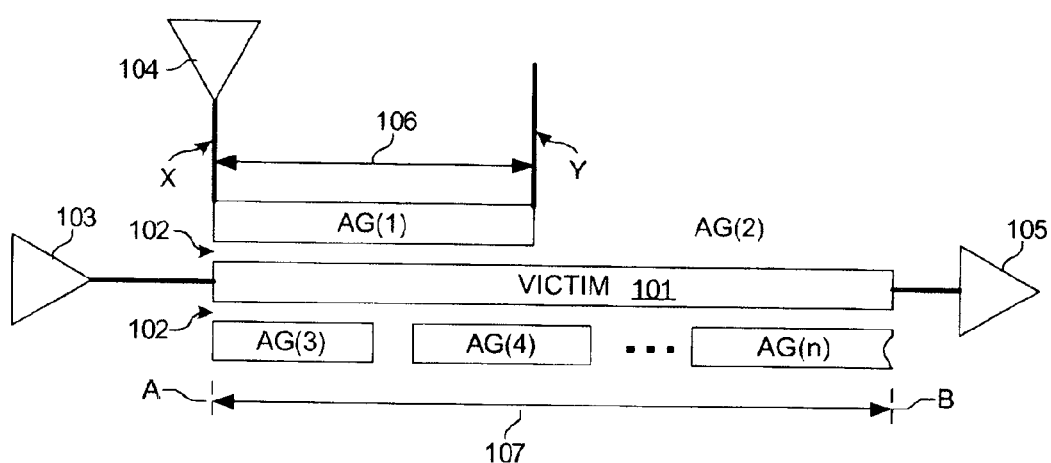
FIG. 1 is a diagram illustrating an example wherein multiple drivers are connected to a set of on-chip interconnects.

FIG. 1 is a diagram illustrating an example wherein multiple drivers are connected to a set of on-chip interconnects. As shown in FIG. 1, a 'victim' line 101, extending between points A and B (indicated by arrow 107), and terminated by a driver 103 and a receiver 105, is located between, and parallel to, several 'aggressor' lines AG(1)–AG(n). The relationship between a 'victim' and an 'aggressor' is a relative one for a given analysis perspective. Specifically, a victim is viewed as the line whose signal propagation time is affected as a result of each transient signal propagated via one or more aggressors, even though the signal being propagated through the victim also affects the signal delay through each aggressor line.

Only one complete interconnect is shown in FIG. 1, for the purpose of clarity. This interconnect, shown for aggressor AG(1), is composed of the section represented by arrow 106, plus the sections shown by arrows X (coupled to driver 104) and Y. Only the sections of aggressors AG(2)–AG(n) that are parallel to victim line 101 are shown, because only the sections that are parallel to a given victim exert any significant signal delay influence on the victim. Sections of aggressor interconnects that are perpendicular to a particular victim line do not significantly affect the signal propagation time of signals propagated via the victim.

Noise Waveform

Utilizing the superposition property of electronic circuits, one can decompose the output waveform of a given victim line derived by a number of aggressors into two sets: a without-noise waveform caused by the switching at the victim input, and a set of noise signals caused by the aggressors when the victim line is dead (inactive). Let $f_i(t)$ be the noise signals, and $g(t)$ be the without-noise signal. The following shape functions are used by the present method to represent waveforms for f and g:

$$g(t) = V_{dd} 2^{-e^{-\left(\frac{t-v}{\tau_r}\right)}} \quad (1)$$

$$f_i(t) = V_{pi} e^{-\beta_i \ln^2\left(\frac{t}{\mu_i}\right)} \quad (2)$$

where $V_{dd}$ is the supply voltage, $V_{pi}$ is the peak voltage of the noise signal occurring at time $\mu_i$ when aggressor i switches, $\beta_i$ is a shaping factor of the noise waveform describing its width, $\tau_r$ is the rise time of the victim output without-noise signal, and v is the delay of the without-noise signal.

First, let the switching at the victim output node be the time-zero reference of all signals $$\left(\text{i.e., when } g(t=v) = \frac{1}{2} V_{dd}\right).$$

Then let $k_i$ be the difference of the input switching times between aggressor i and the input switching of the victim line. Therefore, the time variable of Equation (2) is modified to $t \rightarrow (t-k_i)$. Employing the superposition property at the output node of the victim line, the output voltage signal, O(t), becomes:

$$O(t) = g(t) + \sum_{i=1}^{n} f_i(t_i, k_i) \quad (3)$$

with a reference time-zero at t=v.

Delay Change Curve Based on Quadratic Expansion

The propagation delay of the victim signal is not only affected by the number of switching aggressors but also by the relative switching times between the victim and the aggressors. From Equation (3), the delay of the victim signal is determined as follows:

$$O(t) = \frac{V_{dd}}{2} \quad (4)$$

If Equation (4) is solved for t, then the delay is the function of the relative signal arrival times between the victim and the aggressors, $k_i$. This relationship is referred to as the delay change curve (due to aggressors' noise), $$dcc(\vec{k}).$$

However, Equation (4) has no closed form solution.

If Equation (4) is expanded to the first order Taylor series around t=v, using a linear function, the resulting dcc (delay change curve) equation has a linear part of k, and an exponential part, given that one aggressor is affecting the victim line. Deriving statistical expectations out of such a simple and non-differentiable dcc function produces relatively inaccurate results because of the inaccurate approximations of the delay, especially around the peak value, i.e., when the noise peak of the aggressor arrives near the time-zero reference of the victim signal. However, since the peak region of the noise signal, f(t), has a parabolic shape, Equation (3) can be expanded to its second order Taylor series around t=v. The present method solves Equation (4) by second order Taylor expansion around t=v using the first and the second order derivatives as shown in Equations (5)–(8). The resulting quadratic equation to approximate Equation (3) is shown in Equation (9). Equation (3) may also be approximated by the use of a linear function derived in a similar fashion, i.e., by solving Equation (4) using a first order Taylor expansion around t=v.

$$g'(v) = \frac{V_{dd} \ln 2}{2\tau_r} \quad (5)$$

$$g''(v) = \frac{V_{dd} \ln 2 (1 - \ln 2)}{2\tau_r^2} \quad (6)$$

For the noise signals, $f_i(t, k_i)$, we have:

$$f_i'(v, k_i) = -2 v_{p_i} \beta_i \frac{\ln\left(\frac{v-k_i}{\mu_i}\right) e^{-\beta_i \ln^2\left(\frac{v-k_i}{\mu_i}\right)}}{2\tau_r} \quad (7)$$

$$f_i''(v, k_i) = -2 v_{p_i} \beta_i \frac{\left[1 - \ln\left(\frac{v-k_i}{\mu_i}\right) - 2\beta_i \ln^2\left(\frac{v-k_i}{\mu_i}\right)\right] e^{-\beta_i \ln^2\left(\frac{v-k_i}{\mu_i}\right)}}{2\tau_r} \quad (8)$$

Therefore, Equation (3) can be approximated as:

$$O(t) \cong \left(g(v) + \sum_{i=1}^{n} f_i(v, k_i)\right) + \left(g'(v) + \sum_{i=1}^{n} f_i'(v, k_i)(t-v)\right) + \frac{1}{2}\left(g''(v) + \sum_{i=1}^{n} f_i''(v, k_i)(t-v)\right)(t-v)^2 + O(t-v)^2 \quad (9)$$

The solution of the delay change curve, $$dcc(\vec{k}),$$

is obtained by solving Equation (4) with respect to (t–v) using the approximation in Equation (9):

$$dcc(\vec{k}) = -\frac{\sum_1 \pm \sqrt{\sum_2}}{\sum_3} \quad (10)$$

where:

$$\sum\nolimits_1 = g'(v) + \sum_{i=1}^{n} f_i'(v, k_i)$$

$$\sum\nolimits_2 = \left(g'(v) + \sum_{i=1}^{n} f_i'(v, k_i)\right)^2 - 4\left(g(v) + \sum_{i=1}^{n} f_i(v, k_i) + \frac{V_{dd}}{2}\right)\frac{1}{2}\left(g''(v) + \sum_{i=1}^{n} f_i''(v, k_i)(t-v)\right)$$

$$\sum_{3} = g''(v) + \sum_{i=1}^{n} f_i''(v, k_i)(t-v)$$

Application

The method of quadratic dcc determination presented in the previous section can be applied to statistical timing analysis with multiple and partial interconnect coupling. FIG. 1 illustrates a simple test structure comprising a victim line 101 in the middle and the several aggressor lines AG(1)–AG(n) parallel, and in proximity to, the victim line.

In a typical VLSI chip, the distance (shown by arrows 102) between a victim line 101 and aggressor lines typically can be as small as 0.4 microns. Such close interconnect proximity results in strongly coupled interconnects in VLSI chips, which can have a significant impact on chip performance. The process variations and the variations of chip's operating environment such as temperature and supply voltage will cause the signal arrival times at both the victim and the aggressors to be non-deterministic. Such a non-deterministic behavior can be described as a random process governed by its statistical behavior.

As the result of the variations of the signal arrival times at both the victim and the aggressors, the signal delay through a victim line is also non-deterministic because its dependency on signal arrival time differences as demonstrated by the delay change curve, dcc. This non-deterministic behavior can be represented by its statistical mean and standard deviation. The receivers of a coupled interconnect can, then, take the statistical behavior at their inputs (resulting from the coupled interconnects) and further derive the statistical behavior of the down-stream components.

Figure 2A:
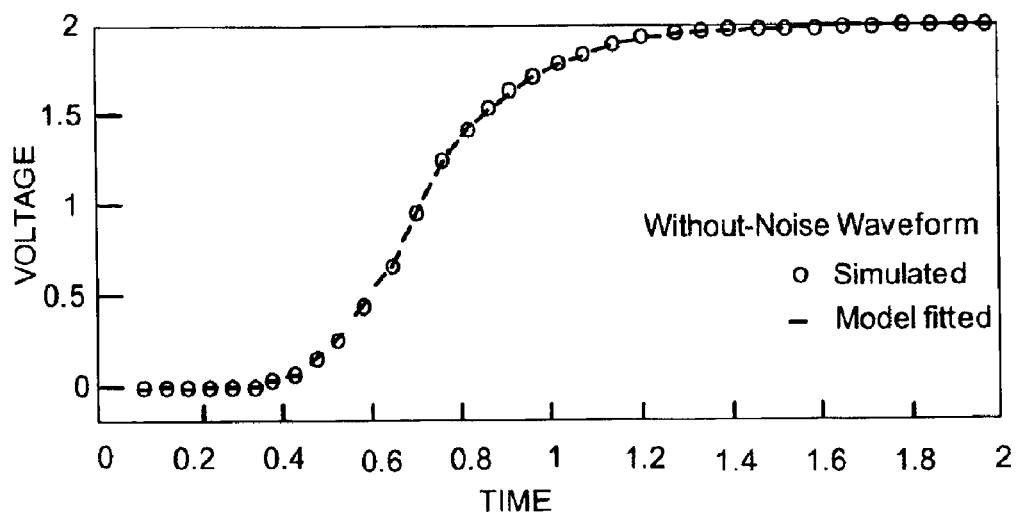
FIG. 2A is a graphical diagram showing simulated and fitted waveforms for a without-noise waveform caused by the switching at the victim input.
Figure 2B:
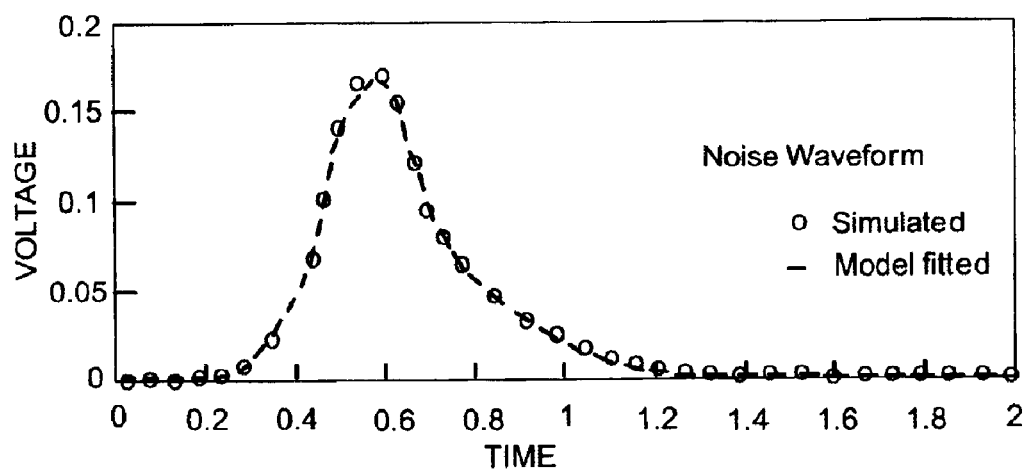
FIG. 2B is a graphical diagram showing simulated and fitted waveforms for a waveform showing noise caused by the switching on an aggressor line.
Figure 3:
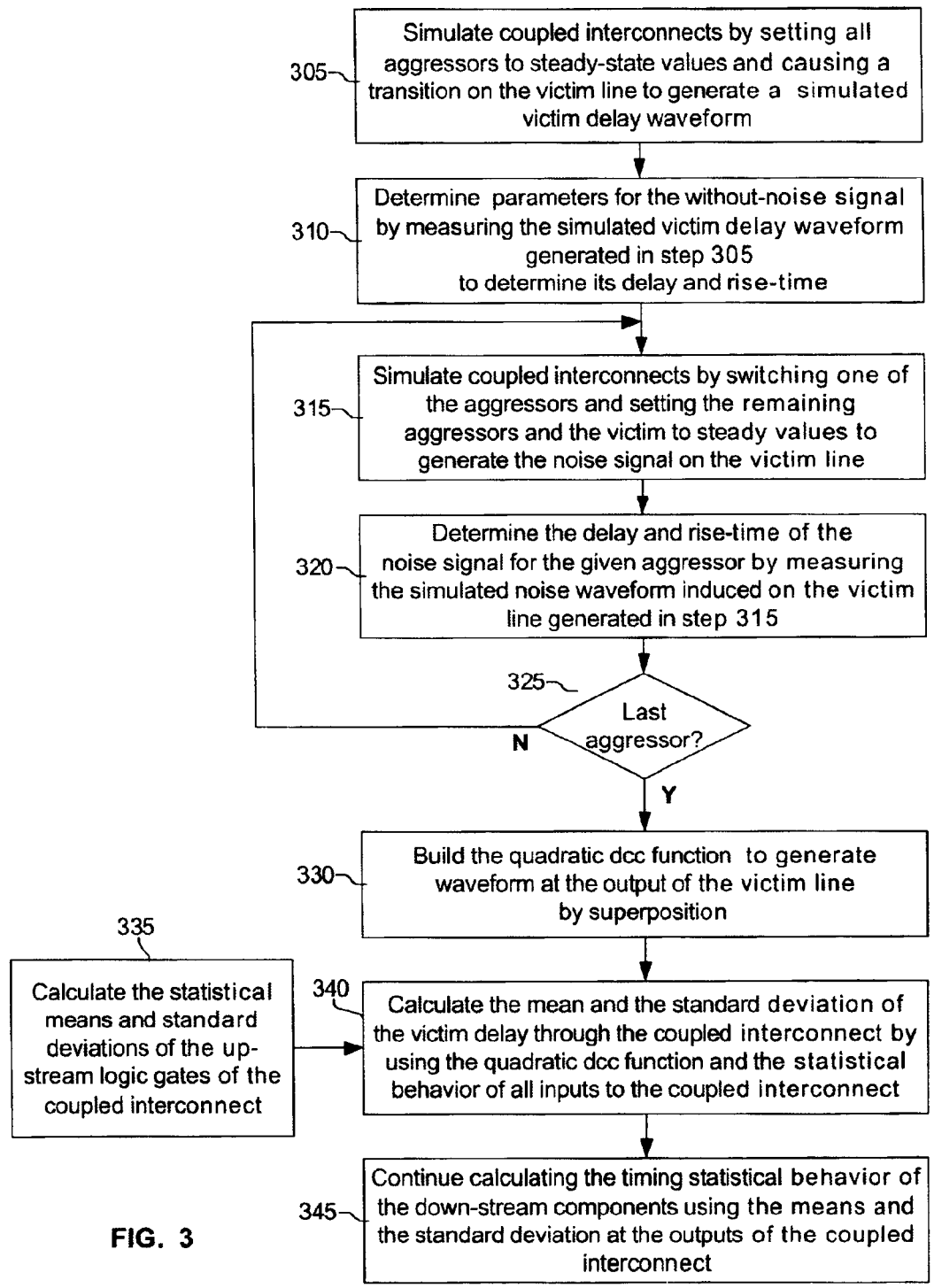
FIG. 3 is a flowchart illustrating, at a high level, steps which may be performed in practicing one embodiment of the method of the present invention.

FIG. 2A is a graphical diagram showing simulated and fitted waveforms for a without-noise waveform caused by the switching at the victim input, and FIG. 2B is a graphical diagram showing simulated and fitted waveforms for a waveform showing noise caused by the switching on an aggressor line. FIG. 3 shows an exemplary set of steps involved an application of the quadratic delay change calculation method described herein to determine the statistical behavior of digital circuits involving strongly coupled interconnects. Operation of the present method is best understood by viewing FIGS. 1, 2A/B, and 3 in conjunction with one another. The process described below shows the use of model-fitted equations to determine dcc. In order to determine dcc, simulated curves are first used to determine the parameters in the model-fitted Equations 1 and 2. These model-fitted equations are then used to derive the output waveform at the output of the victim line (as shown in Equation 3) using superposition. The output waveform is then quadratically expanded to obtain the delay change curve, dcc.

As shown in FIG. 3, at step 305, the coupled interconnects comprising victim 101 and aggressors AG(1)–AG(n) are simulated to generate the 'simulated' victim without-noise delay waveform shown in FIG. 2A, by setting all the aggressors to steady values and causing a transition on the victim line. At step 310, the parameters in Equation (1) are calculated to generate the 'model fitted' waveform shown in FIG. 2A by measuring the simulated without-noise waveform generated in step 305 to determine its delay and rise-time. Measuring the simulation results involves determining the location of the peak noise voltage in terms of time, by, e.g., noting the zero-crossing of its gradient. Peak noise, rise time and signal delay may be measured with a circuit simulator such as SPICE. The shape factor, or the noise width, can also be measured with a circuit simulator.

At step 315, the coupled interconnects are simulated to generate the 'simulated' noise signal on the victim line waveform shown in FIG. 2B, by switching one of the aggressors, e.g., AG(1), and setting the rest of the aggressors and the victim to steady-state values. At step 320, the parameters in Equation (2) are determined for a given aggressor by measuring the simulated noise waveform (induced on the victim line) generated in step 315, to generate a model-fitted waveform representing the delay and rise-time of the noise signal. At step 325, if measurements for all aggressor lines presently of interest [e.g., lines AG(1)–AG(4)] have not been made, then steps 315 and 320 are repeated.

At step 330, the victim's output voltage are derived using the fitted models generated from the previous steps [by Equations (1) and (2)] through superposition onto the without-noise waveform (from step 310), of each of the noise waveforms generated in step 320. The combined output voltage waveform is shown in Equation (3). The first-order and the second-order derivatives of the fitted models are obtained as shown in Equations 5–8 to allow Taylor expansion of Equation (3) to obtain a simplified quadratic waveform for victim's output around (t–v) as shown in Equation (9). By solving Equation (9) with respect to (t–v) for output delay (i.e., setting the output voltage to Vdd/2), the quadratic dcc function is constructed. The quadratic dcc function, shown by Equation (10), functions as an analytical model and describes the cumulative impact of different aggressors on a given victim.

At step 335, the statistical means and standard deviations of delay of the up-stream logic gates [e.g., AG(1)–AG(4)] of the coupled interconnects are calculated using a circuit simulator such as SPICE. These statistical means and standard deviations are used to determine the nominal arrival time differences between the aggressors and the victim and the standard deviations of those arrival time differences. This process may involve changing the transistor channel lengths of up-stream drivers based on process variation information and deriving the changes of gate (driver) delays due to the change in transistor channel lengths to obtain sensitivity of delay change with respect to transistor channel length, $\phi$. The standard deviation of the gate delay due to transistor channel length can be calculated using Equation (11), where n is the number of transistors in the gate that impact the delay of the gate. Parameters that may affect up-stream logic gate delays also include temperature variations, transistor threshold voltage variations, and power supply voltage variations. The delay variations of the up-stream logic gates due to those parameters can be calculated in a similar way as that due to transistor channel length variations as shown in Equation 11. Note that the delay variations of up-stream logic gates are not functions of the coupled interconnect.

$$\sigma_{le} = \sqrt{\sum_{i=1}^{n} (\varphi \sigma_{le\_i})^2} \quad (11)$$

Figure 4:
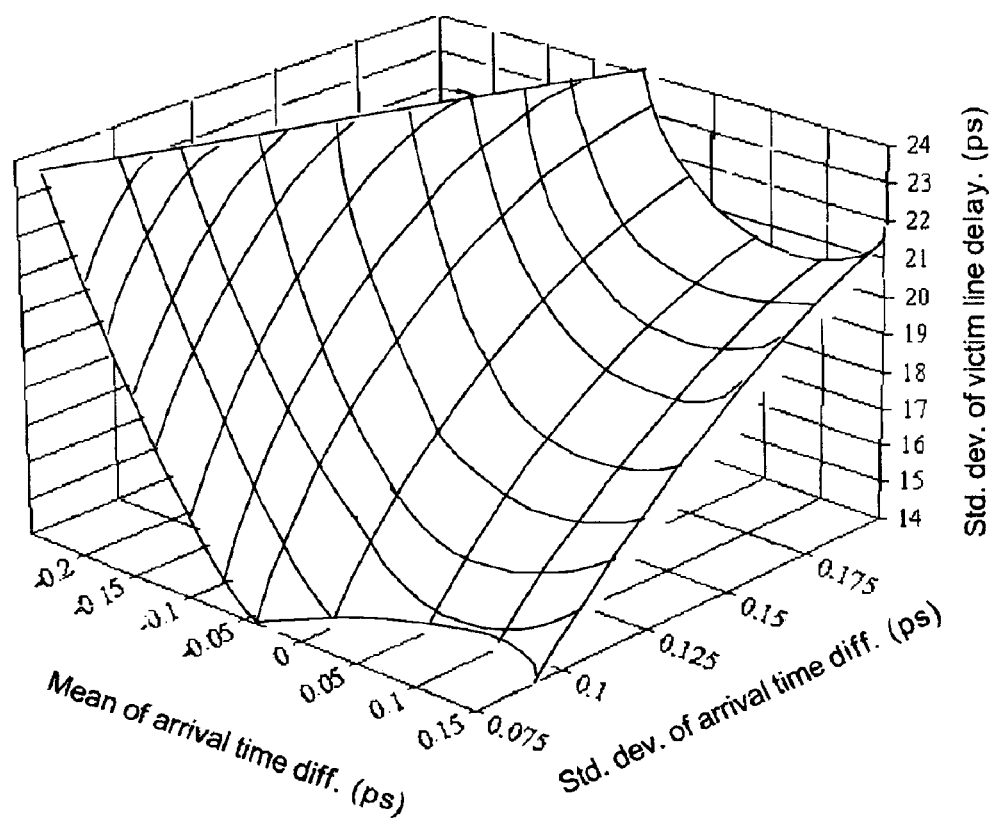
FIG. 4 is a graphical diagram showing sample results from the output of step 340 for a victim line and a plurality of aggressor lines.

At step 340, the mean and the standard deviation of the victim delay through the coupled interconnect 101 are calculated by using the quadratic dcc model obtained from step 330 and the statistical behavior of all the inputs to the coupled interconnect obtained from step 335. The mean and the standard deviation of the victim delay are determined by applying the results obtained from step 335 to the delay change curve in Equation (10). This process may involve generating random samples of aggressor/victim arrival times based on their statistical behavior derived from step 335 and applying these samples to Equation 10 to obtain the random delay changes and their statistical behavior (i.e., standard deviation) at the output of the victim line 101. Table 1, below, shows sample results from step 340 for a victim line and a plurality of aggressor lines, including input mean arrival time difference, the standard deviation of input arrival time difference, and the standard deviation of the line's delay. A graphical representation of table 1 is also shown in FIG. 4.

TABLE 1

| input mean arrival time difference | std of input arrival time difference | std of victim line's delay |
| --- | --- | --- |
| 0 | 0.1 | 14.86 |
| 0.03 | 0.15 | 18.52 |
| 0.09 | 0.19 | 19.97 |
| 0.11 | 0.18 | 20.14 |
| −0.21 | 0.08 | 23.91 |

At step 345, calculation of the timing statistical behavior of the down-stream components [e.g., lines AG(5)–AG(n)] is continued using the means and the standard deviation at the outputs of the coupled interconnect and the sensitivity analysis method shown in Equation (11).

Standard Deviation Results

Assuming that the arrival times of the different aggressors have normal distributions with known mean and known standard deviation, 500 random ki values were generated out of their distributions and evaluated using the quadratic dcc functions. Depending on the relative time at the aggressors' peak value, the errors of delay variation predicted by the quadratic dcc model and the Monte Carlo simulations range from 1% to 20%. For the region where delay variations will be impacted the most, i.e., where the relative arrival times between the aggressors and victim are small, the errors are well below 10%. The higher errors in other cases were mainly caused by extremely small deviations of both the Monte Carlo simulation results and the model prediction results. The absolute errors in these cases are very small. The detailed results are shown in Table 2. The first column of Table 2, $\mu_k$ shows the mean difference of arrival times, in nanoseconds, between a victim and aggressors; and the second column shows $\sigma_k$, the standard deviation of arrival times (in nanoseconds) between a sample victim and a plurality of aggressors. The third and fourth columns show comparative dcc values for a SPICE simulation and the values calculated using the present method (both in picoseconds), with the percentage difference between those values (i.e., the percentage error in a calculation according to the present method) indicated in the last column.

TABLE 2

Quadratic $\sigma_{dcc}$ for Difference k Statistics (ps)

| Statistics | | Spice | Quadratic | |
| --- | --- | --- | --- | --- |
| $U_k$ (ns) | $\sigma_k$ (ns) | $\sigma_{dcc}$ | $\sigma_{dcc}$ | % Er |
| 0.00 | 0.10 | 15.01 | 14.86 | 1% |
| 0.03 | 0.15 | 19.99 | 18.52 | 7% |
| 0.09 | 0.19 | 20.69 | 19.97 | 3% |
| 0.11 | 0.18 | 20.11 | 20.14 | 0% |
| −0.21 | 0.18 | 26.40 | 23.91 | 9% |
| −0.52 | 0.08 | 2.11 | 1.85 | 12% |
| −0.64 | 0.08 | 0.89 | 0.74 | 17% |
| −0.78 | 0.04 | 0.050 | .06 | 20% |

While exemplary embodiments of the present invention have been shown in the drawings and described above, it will be apparent to one skilled in the art that various embodiments of the present invention are possible. For example, the particular configuration of the interconnects shown in FIG. 1, as well as the specific steps shown in the flowchart of FIG. 3, should not be construed as limited to the specific embodiments described herein. Modification may be made to these and other specific elements of the invention without departing from its spirit and scope as expressed in the following claims.

What is claimed is:

1. A method for determining a waveform of a signal on a victim line resulting from switching transients on a plurality of aggressor lines, where each of the aggressor lines represents a coupled interconnect with respect to the victim line, the method comprising the step of:

superimposing a noise signal on aggressor lines, where the noise signal for each aggressor line is determined by the peak voltage of the noise signal occurring at the time when the aggressor line switches, times an exponential decay factor comprising the shaping factor of the victim line and the time when the aggressor line switches;

wherein the without-noise waveform of the victim line is determined by the supply voltage times an exponential delay factor comprising the delay of the without-noise signal and the rise time of the victim output without-noise signal.

2. The method of claim 1, including:

performing, for each of the aggressor lines, the steps of:
simulating a coupled interconnect by setting all aggressor lines to steady-state values and causing a transition on the victim line, to generate a simulated victim delay waveform;
determining parameters for a without-noise signal by measuring the simulated victim delay waveform to determine its delay and rise-time;
simulating a coupled interconnect by switching one of the aggressor lines and setting the remaining aggressor lines and the victim line to steady values to generate a simulated noise signal on the victim line; and determining a delay and rise-time of a noise signal for said one of the aggressor lines by measuring the simulated noise signal induced on the victim line; and determining the statistical behavior of a signal delay through the victim line due to random delay changes resulting from switching transients on the plurality of aggressor lines, by performing the steps of:

building a quadratic function representing the delay change curve of the victim line, to generate a waveform at the output of the victim line by superposition, onto the without-noise signal, of the noise signal of each of the aggressor lines;

calculating the statistical means and standard deviations of up-stream logic gates of the coupled interconnect; and calculating the statistical mean and the standard deviation of the victim delay through the coupled interconnect by using said quadratic function and the statistical behavior of all inputs to the coupled interconnect.

3. The method of claim 2, wherein said quadratic function comprises a second order Taylor series around a reference time-zero value (t–v), where v is the delay of the without-noise signal.

4. The method of claim 2, wherein the function representing the delay change curve of the victim line is a linear function.

5. The method of claim 4, wherein said linear function is a first order Taylor expansion around a reference time-zero value (t–v), where v is the delay of the without-noise signal.

6. The method of claim 2, including the additional step of calculating the timing statistical behavior of down-stream components using the means and the standard deviation at the outputs of the coupled interconnect.

7. The method of claim 2, wherein the statistical behavior of the signal delay through the victim line is determined in part by changing transistor channel lengths of up-stream drivers based on process variation information and deriving the changes of driver delays due to the change in transistor channel lengths to obtain sensitivity of delay change with respect to transistor channel length.

8. A method for generating a delay change curve for a victim line resulting from switching transients on a plurality of aggressor lines, where each of the aggressor lines represents a coupled interconnect with respect to the victim line, the method comprising:

performing, for each of the aggressor lines, the steps of:

determining parameters for a without-noise signal by measuring a simulated victim delay waveform to determine its delay and rise-time; and determining a delay and rise-time of a noise signal for said one of the aggressor lines aggressor by measuring a simulated noise waveform induced on the victim line; and determining the statistical behavior of a signal delay through the victim line due to random delay changes resulting from switching transients on the plurality of aggressor lines, by performing the steps of:

building a quadratic function representing the delay change curve of the victim line, to generate a waveform at the output of the victim line by superposition, onto the without-noise signal, of the noise signal of each of the aggressor lines;

calculating the statistical means and standard deviations of up-stream logic gates of the coupled interconnect; and calculating the statistical mean and the standard deviation of the victim delay through the coupled interconnect by using said quadratic function and the statistical behavior of all inputs to the coupled interconnect.

9. The method of claim 8, including the additional steps of:

simulating a coupled interconnect by generating a simulated victim delay waveform by setting all aggressor lines to steady-state values and causing a transition on the victim line; and simulating a coupled interconnect by switching one of the aggressor lines and setting the remaining aggressor lines and the victim line to steady values to generate a simulated noise signal on the victim line.

10. The method of claim 9, wherein said quadratic function comprises a second order Taylor series around a reference time-zero value (t–v), where v is the delay of the without-noise signal.

11. The method of claim 8, wherein the function representing the delay change curve of the victim line is a first order Taylor expansion around a reference time-zero value (t–v).

12. The method of claim 8, including the additional step of calculating the timing statistical behavior of down-stream components using the means and the standard deviation at the outputs of the coupled interconnect.

13. A method for determining the statistical behavior of a signal delay through a victim line due to random delay changes resulting from switching transients on a plurality of aggressor lines, where each of the agressor lines represents a coupled interconnect with respect to the victim line, by performing the steps of:

building a quadratic function representing the delay change curve of the victim line, to generate a waveform at the output of the victim line by superposition, onto the without-noise signal of the victim line, of the noise signal of each of the aggressor lines;

calculating the statistical means and standard deviations of up-stream logic gates of the coupled interconnect; and calculating the statistical mean and the standard deviation of the victim delay through the coupled interconnect by using said quadratic function and the statistical behavior of all inputs to the coupled interconnect;

wherein said quadratic function comprises a second order Taylor series around a reference time-zero value (t–v), where v is the delay of the without-noise signal.

14. The method of claim 13, including performing, for each of the aggressor lines, prior to the building step, the steps of:

determining parameters for a without-noise signal by measuring a simulated victim delay waveform to determine its delay and rise-time; and determining a delay and rise-time of a noise signal for said one of the aggressor lines aggressor by measuring a simulated noise waveform induced on the victim line.

15. The method of claim 14, including the additional steps of:

simulating a coupled interconnect by generating said simulated victim delay waveform by setting all aggressor lines to steady-state values and causing a transition on the victim line; and simulating a coupled interconnect by switching one of the aggressor lines and setting the remaining aggressor lines and the victim line to steady values to generate said simulated noise waveform on the victim line.

16. The method of claim 15, including the additional step of calculating the timing statistical behavior of down-stream components using the means and the standard deviation at the outputs of the coupled interconnect.

17. The method of claim 16, wherein the function representing the delay change curve of the victim line is a first order Taylor expansion around a reference time-zero value (t–v).

18. The method of claim 17, wherein the statistical behavior of the signal delay through the victim line is determined in part by changing transistor channel lengths of up-stream drivers based on process variation information and deriving the changes of driver delays due to the change in transistor channel lengths to obtain sensitivity of delay change with respect to transistor channel length.

19. A method for generating a delay change curve for a victim line resulting from switching transients on a plurality of aggressor lines, where each of the aggressor lines represents a coupled interconnect with respect to the victim line, the method comprising the steps of:

generating an approximation equation representing an output voltage signal on the victim line by expanding a first equation representing the output voltage signal on the victim line to its second order Taylor series around a reference time-zero, using the first and the second order derivatives of the first equation;

where said first equation is equal to the victim line without-noise signal plus the sum, for all aggressor lines, of the victim noise signal at a time representing the nominal difference of the input switching time between a given one of the aggressor lines and the input switching of the victim line; and determining a quadratic delay change curve function by solving the approximation equation with respect to a reference time-zero value (t–v), where v is the delay of the without-noise signal.

20. The method of claim 19, wherein the output voltage signal on the victim line in said approximation equation is equal to the without-noise signal of the victim line when the victim line switches at its nominal arrival time plus the sum of all the noise signals induced on to the victim line through coupling by individual aggressor lines when the victim line switches at its nominal arrival time.

21. The method of claim 19, wherein the quadratic delay change curve function is determined by solving the approximation equation with the output voltage set to a value of one half of the supply voltage.

22. The method of claim 19, wherein the approximation equation is generated by expanding said first equation to its first order Taylor series around a reference time-zero value (t–v).

23. The method of claim 15, including the additional step of calculating the timing statistical behavior of down-stream components using the means and the standard deviation at the outputs of the coupled interconnect.

* * * * *